United States Patent
Dubourdieu et al.

(10) Patent No.: US 9,590,100 B2
(45) Date of Patent: Mar. 7, 2017

(54) SEMICONDUCTOR DEVICES CONTAINING AN EPITAXIAL PEROVSKITE/DOPED STRONTIUM TITANATE STRUCTURE

(71) Applicant: International Business Machines Corporation, Armonk, NY (US)

(72) Inventors: Catherine A. Dubourdieu, Grenoble (FR); Martin M. Frank, Dobbs Ferry, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/994,821

(22) Filed: Jan. 13, 2016

(65) Prior Publication Data

US 2016/0133753 A1    May 12, 2016

Related U.S. Application Data

(63) Continuation of application No. 14/300,835, filed on Jun. 10, 2014, now Pat. No. 9,299,799.

(51) Int. Cl.
| | | |
|---|---|---|
| H01L 21/28 | (2006.01) | |
| H01L 29/78 | (2006.01) | |
| H01L 29/49 | (2006.01) | |
| H01L 29/51 | (2006.01) | |
| H01L 29/66 | (2006.01) | |

(52) U.S. Cl.
CPC .. *H01L 29/78391* (2014.09); *H01L 21/28088* (2013.01); *H01L 21/28291* (2013.01); *H01L 29/4966* (2013.01); *H01L 29/513* (2013.01); *H01L 29/516* (2013.01); *H01L 29/517* (2013.01); *H01L 29/6684* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 5,240,906 A | | 8/1993 | Bednorz et al. |
| 5,365,094 A | * | 11/1994 | Takasu ............. H01L 27/11502 257/295 |
| 5,418,389 A | | 5/1995 | Watanabe |
| 6,518,609 B1 | | 2/2003 | Ramesh |
| 6,593,229 B1 | | 7/2003 | Yamamoto et al. |
| 6,709,989 B2 | | 3/2004 | Ramdani et al. |

(Continued)

OTHER PUBLICATIONS

Lee, et. al, Epitaxial growth of non-c-oriented ferroelectric SrBi2Ta2O9 thin films on SrTiO3 substrates, Journal of the European Ceramic Society 21 (2001) 1565-1568.*

(Continued)

*Primary Examiner* — Charles Garber
*Assistant Examiner* — Alia Sabur
(74) *Attorney, Agent, or Firm* — Scully, Scott, Murphy & Presser, P.C.; Vazken Alexanian

(57) ABSTRACT

Semiconductor devices are provided such as, ferroelectric transistors and floating gate transistors, that include an epitaxial perovskite/doped strontium titanate structure formed above a surface of a semiconductor substrate. The epitaxial perovskite/doped strontium titanate structure includes a stack of, in any order, a doped strontium titanate and a perovskite type oxide.

15 Claims, 7 Drawing Sheets

(56) References Cited

U.S. PATENT DOCUMENTS

| | | | |
|---|---|---|---|
| 7,095,067 | B2 | 8/2006 | Hwang et al. |
| 2002/0038402 | A1* | 3/2002 | Kanaya ............ H01L 21/28273 |
| | | | 711/1 |
| 2006/0038242 | A1* | 2/2006 | Hsu ...................... H01L 29/516 |
| | | | 257/407 |
| 2007/0132003 | A1* | 6/2007 | Takashima ............ H01L 27/115 |
| | | | 257/315 |
| 2012/0086059 | A1 | 4/2012 | Dubourdieu et al. |
| 2012/0292677 | A1 | 11/2012 | Dubourdieu et al. |
| 2012/0293677 | A1 | 11/2012 | Ostrovsky |
| 2013/0240871 | A1 | 9/2013 | Shimoda et al. |

OTHER PUBLICATIONS

Robertson, et al. High dielectric constant gate oxides for metal oxide Si transistors, Rep. Prog. Phys. 69 (2009) 327-396.*

Liu, B.T., et al., "Epitaxial La-doped SrTiO3 on silicon: A conductive template for epitaxial ferroelectrics on silicon", Applied Physics Letters, Jun. 24, 2002, vol. 80, No. 25.

Kozuka, Y., et al., "Dramatic mobility enhancements in doped SrTiO3 thin films by defect management", Applied Physics Letters, published online Jul. 8, 2010, Electronic Transport and Semiconductors, vol. 97, Issue 1.

Cano, A., et al., "Multidomain ferroelectricity as a limiting factor for voltage amplification in ferroelectric field-effect transistors", Applied Physics Letters, Device Physics, published online Sep. 30, 2010, vol. 97, Issue 13.

Vaithyanathan, V., et al., "C-axis oriented epitaxial BaTiO3 films on (001) Si", Journal of Applied Physics, published online Jul. 27, 2006, Dielectrics and Ferroelectricity, vol. 100, Issue 2.

Niu, G., et al., "Epitaxy of BaTiO3 thin film on Si(0 0 1) using a SrTiO3 buffer layer for non-volatile memory application", Journal Microelectronic Engineering archive, Jul. 2011, vol. 88, Issue 7, pp. 1232-1235.

Son, J., et al., "Epitaxial SrTiO3 films with electron mobilities exceeding 30,000 cm2 V-1 s-1", Nature Materials, Letters, Published Online: April 4, 2010, pp. 482-484.

Niu, F., et al., "Epitaxial growth and strain relaxation of BaTiO3 thin films on SrTiO3 buffered (001) Si by molecular beam epitaxy", J. Vac. Sci. Technol. B 25(3), May/Jun. 2007, pp. 1053-1057.

Frank, D., et al., "The Quantum Metal Ferroelectric Field-Effect Transistor", Nano Letters, Nov. 20, 2013, 25 pages.

Robertson, J., "High dielectric constant gate oxides for metal oxide Si transistors", Institute of Physics Publishing Reports on Progress in Physics, Rep. Prog. Phys., Published Dec. 2005, pp. 327-396, 69.

Eisenbeiser, K., et al., "Field effect transistors with SrTi03 gate dielectric on Si", Applied Physics Letters, Mar. 6, 2000, pp. 1324-1326, vol. 76, No. 10.

Lee, H. N., et al., "Epitaxial growth of non-c-oriented ferroelectric SrBi2 Ta20 9 thin film1s on SrTi03 substrates", Journal of the European Ceramic Society, 21, accepted Oct. 2000, pp. 1565-1568.

Eror, N.G., "High-Temperature Defect Structure of Acceptor-Doped Strontium Titanate", J. Amer. Chem. Soc., Sep. 1982, pp. 428-431, vol. 65, No. 9.

List of IBM Patents or Patent Applications Treated as Related dated Jan. 12, 2016, 2 pages.

* cited by examiner

SEMICONDUCTOR DEVICES CONTAINING AN EPITAXIAL PEROVSKITE/DOPED STRONTIUM TITANATE STRUCTURE

BACKGROUND

The present invention relates to semiconductor devices, and more particularly to semiconductor devices including an epitaxial perovskite/doped strontium titanate structure, and methods of forming the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY

Semiconductor devices are provided such as, ferroelectric transistors and floating gate transistors, that include an epitaxial perovskite/doped strontium titanate structure formed above a surface of a semiconductor substrate. The epitaxial perovskite/doped strontium titanate structure includes a stack of, in any order, a doped strontium titanate and a perovskite type oxide.

In one aspect of the present invention, a semiconductor device, e.g., ferroelectric transistor, is provided. The semiconductor device of the present invention includes a semiconductor substrate having a source region and a drain region located within the semiconductor substrate and separated by a channel region. The semiconductor device of the present invention also includes a ferroelectric gate stack located above the channel region and including, from bottom to top, an undoped strontium titanate portion, and, in any order, a ferroelectric perovskite material portion and a doped strontium titanate portion, wherein the doped strontium titanate portion contains a dopant other than Nb, Ta or V. In some embodiments, a gate electrode material portion can be located on the topmost surface of the ferroelectric gate stack. In some embodiments, the ferroelectric transistor can be a ferroelectric memory transistor.

In another aspect of the present invention, a semiconductor device, e.g., floating gate transistor, is provided. The semiconductor device of the present invention includes a semiconductor substrate having a source region and a drain region located within the semiconductor substrate and separated by a channel region. The semiconductor device of the present invention further includes a first insulator material portion located directly above the channel region, a doped strontium titanate portion located directly above the first insulator material portion, a second insulator material portion located directly above the doped strontium titanate portion, and a control gate located on an upper surface of the second insulator material portion.

In yet another aspect of the present invention, a method of forming a semiconductor device, e.g., ferroelectric transistor, is provided. In one embodiment, the method of forming the semiconductor device can begin with forming an undoped strontium titanate layer atop an upper surface of a semiconductor substrate. A material stack comprising, in any order a ferroelectric perovskite material layer and a doped strontium titanate layer is formed atop the undoped strontium titanate layer. In accordance with the present invention, the doped strontium titanate layer of the ferroelectric material transistor contains a dopant other than Nb, Ta or V. The undoped strontium titanate layer, the ferroelectric perovskite material layer and the doped strontium titanate layer are then patterned into a gate stack comprising, from bottom to top, an undoped strontium titanate portion, and, in any order, a ferroelectric perovskite material portion and a doped strontium titanate portion. Next, a source region is formed on one side of the gate stack and a drain region is formed on another side of the ferroelectric gate stack.

In yet a further aspect of the present invention, a method of forming a semiconductor device, e.g., floating gate transistor, is provided. In one embodiment, the method of forming the semiconductor device of the present invention includes forming a first insulator material layer on an upper surface of a semiconductor substrate. Next, a doped strontium titanate layer is formed directly above the first insulator material layer. A second insulator material layer is then formed directly on the doped strontium titanate layer. Next, a control gate layer is formed on an upper surface of the second insulator material layer. The first insulator material layer, the doped strontium titanate layer, the second insulator material layer, and the control gate layer are then patterned into a gate stack comprising, from bottom to top, a first insulator material portion, a doped strontium titanate portion, a second insulator material portion and a control gate. A source region is formed on one side of the gate stack and a drain region is formed on another side of the gate stack.

DETAILED DESCRIPTION

Figure 1:
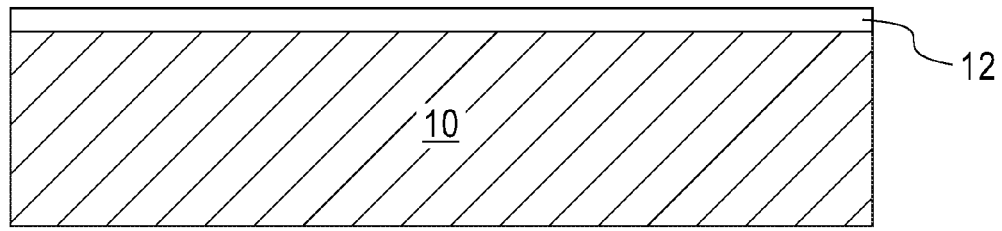
FIG. 1 is a cross sectional view of a first exemplary semiconductor structure after forming a dielectric material layer on an upper surface of a semiconductor substrate in accordance with an embodiment of the present invention.

The present invention will now be described in greater detail by referring to the following discussion and drawings that accompany the present invention. It is noted that the drawings of the present invention are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present invention. However, it will be appreciated by one of ordinary skill in the art that the various embodiments of the present invention may be practiced without these specific details. In other instances, well-known structures or processing steps have not been described in detail in order to avoid obscuring the present invention.

Referring first to FIG. 1, there is illustrated a first exemplary semiconductor structure that is provided after forming a dielectric material layer 12 on an upper surface of a semiconductor substrate 10 in accordance with an embodiment of the present invention. The first exemplary semiconductor structure that is shown in FIG. 1 can be used in the present invention as a substrate for forming a ferroelectric transistor of the present invention. In some embodiments, the ferroelectric transistor that is provided can be a ferroelectric memory transistor. In some embodiments, the dielectric material layer 12 can be omitted from the first exemplary semiconductor structure of the present invention.

In some embodiments of the present invention, the semiconductor substrate 10 can be a bulk semiconductor substrate. When a bulk semiconductor substrate is employed as semiconductor substrate 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor. In one embodiment, the semiconductor substrate 10 can be comprised of a single crystalline semiconductor material, such as, for example, single crystalline silicon. In other embodiments, the semiconductor substrate 10 may comprise a polycrystalline or amorphous semiconductor material.

In another embodiment, a semiconductor-on-insulator (SOI) substrate (not specifically shown) can be employed as the semiconductor substrate 10. Although not specifically shown, one skilled in the art understands that an SOI substrate includes a handle substrate, a buried insulator layer located on an upper surface of the handle substrate, and a semiconductor layer located on an upper surface of the buried insulator layer. The handle substrate provides mechanical support for the buried insulator layer and the semiconductor layer.

The handle substrate and the semiconductor layer of the SOI substrate may comprise the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, and III/V compound semiconductors such as, for example, InAs, GaAs, or InP. Multilayers of these semiconductor materials can also be used as the semiconductor material of the handle substrate and the semiconductor layer. In one embodiment, the handle substrate and the semiconductor layer are both comprised of silicon. In some embodiments, the handle substrate is a non-semiconductor material including, for example, a dielectric material and/or a conductive material. In yet other embodiments the handle substrate can be omitted and a substrate including an insulator layer and a semiconductor layer can be used as semiconductor substrate 10.

In some embodiments, the handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present invention. The handle substrate and/or the semiconductor layer of the SOI substrate may be a single crystalline semiconductor material, a polycrystalline material, or an amorphous material. Typically, at least the semiconductor layer is a single crystalline semiconductor material. In some embodiments, the semiconductor layer that is located atop the buried insulator layer can be processed to include semiconductor regions having different crystal orientations.

The buried insulator layer of the SOI substrate may be a crystalline or non-crystalline oxide or nitride. In one embodiment, the buried insulator layer is an oxide such as, for example, silicon dioxide. The buried insulator layer may be continuous or it may be discontinuous. When a discontinuous buried insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

In one example, the thickness of the semiconductor layer of the SOI substrate can be from 100 Å to 1000 Å. In another example, the thickness of the semiconductor layer of the SOI substrate can be from 500 Å to 700 Å. In some embodiments, and when an ETSOI (extremely thin semiconductor-on-insulator) substrate is employed, the semiconductor layer of the SOI has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above. The buried insulator layer of the SOI substrate typically has a thickness from 10 Å to 2000 Å, with a thickness from 1000 Å to 1500 Å being more typical. The thickness of the handle substrate of the SOI substrate is inconsequential to the present invention.

In some other embodiments, hybrid semiconductor substrates which have different surface regions of different crystallographic orientations can be employed as semiconductor substrate 10. When a hybrid substrate is employed, an nFET is typically formed on a (100) crystal surface, while a pFET is typically formed on a (110) crystal plane. The hybrid substrate can be formed by techniques which are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

Semiconductor substrate 10 may be doped, undoped or contain doped and undoped regions therein. For clarity, the doped regions are not specifically shown in the drawings of the present invention. Each doped region within the semiconductor material of the semiconductor substrate 10 may have the same, or they may have different conductivities and/or doping concentrations. The doped regions that are present in the semiconductor material of semiconductor substrate 10 are typically referred to as well regions and they are formed utilizing a conventional ion implantation process or gas phase doping.

In some embodiments, (not particularly shown), the semiconductor substrate 10 can be processed to include at least one isolation region therein. The at least one isolation region can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. Note that the at least one isolation region may provide isolation between neighboring gate structures, typically required when the neighboring gate structure have opposite conductivities, i.e., n-type transistors and p-type transistors. As such, the at least one isolation region can separate a first device region in which an n-type transistor device can be formed and second device region in which a p-type transistor device can be formed.

As mentioned above, the first exemplary semiconductor structure shown in FIG. 1 further includes a dielectric material layer 12 that is present as a blanket layer on the upper surface of the semiconductor substrate 10. The term "blanket" as used throughout the present invention denotes that a material layer covers an entirety of an underlying material layer. In some embodiments, the dielectric material layer 12 can include an interfacial dielectric material, a dielectric metal oxide or a stack comprising, from bottom to top, an interfacial dielectric material and a dielectric metal oxide.

If present, the interfacial dielectric material can be formed utilizing a thermal process such as, for example, thermal oxidation. In some embodiments of the present invention, a wet chemical oxidation process can be used in forming the interfacial dielectric material. The interfacial layer can also be formed by diffusion of oxygen towards the semiconductor substrate after layer 12 and/or 14 and/or 16 have been deposited. The interfacial dielectric material can be composed of semiconductor oxide (e.g., $SiO_2$) a semiconductor oxynitride (e.g., SiON) and/or a nitrided semiconductor oxide (e.g., SiNO). The thickness of the interfacial dielectric material may be from 0.3 nm to 2 nm, although other thicknesses that are below 0.3 nm and up to 4 nm can be used as for the interfacial dielectric material. Other thicknesses that are lesser than or greater than the aforementioned thickness range can also be employed for the interfacial dielectric material.

If present, the dielectric metal oxide that can be used as the dielectric material layer 12 includes any dielectric material that contains a metallic element and oxygen. The dielectric metal oxides that can be employed in the present invention have a dielectric constant that is greater than silicon dioxide. In some embodiments, the dielectric metal oxides have a dielectric constant of at least 7.0 or greater. Some examples of dielectric metal oxides that can be used in the present invention include, but are not limited to, $HfO_2$, $ZrO_2$, $La_2O_3$, $Y_2O_3$, $Al_2O_3$, $TiO_2$, $CeO_2$, $Ta_2O_5$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $Ta_2O_xN_y$, $SrTiO_xN_y$, $LaAlO_xN_y$, $Y_2O_xN_y$, a silicate thereof, and/or an alloy thereof. Each value of x is independently from 0.5 to 3 and each value of y is independently from 0 to 2. The dielectric metal oxide can be formed by a deposition technique including, for example, chemical vapor deposition (CVD), plasma enhanced chemical vapor deposition (PECVD), physical vapor deposition (PVD), sputtering, molecular beam epitaxy (MBE), and atomic layer deposition (ALD). The dielectric material layer 12 can be amorphous, polycrystalline or single crystalline. In some embodiments, the dielectric material layer 12 can have an epitaxial relationship with a topmost surface of the semiconductor substrate 10. In one embodiment of the present invention, the dielectric metal oxide can have a thickness in a range from 1 nm to 10 nm. Other thicknesses that are lesser than or greater than the aforementioned thickness range can also be employed for the dielectric metal oxide.

Figure 2:
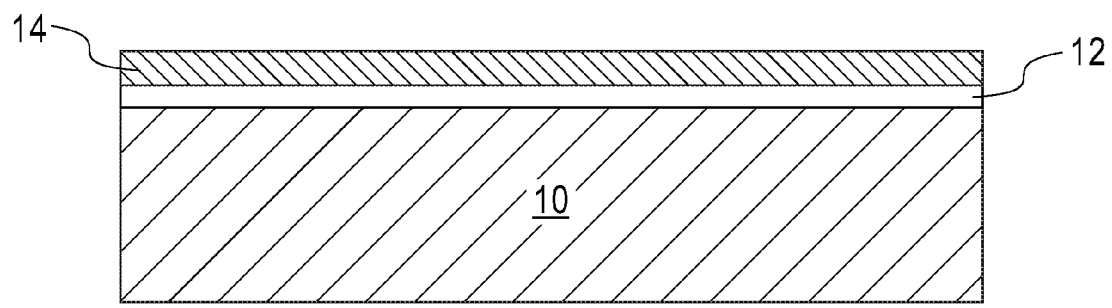
FIG. 2 is a cross sectional view of the first exemplary semiconductor structure of FIG. 1 after forming an undoped strontium titanate layer on the upper surface of the dielectric material layer.

Referring now to FIG. 2, there is illustrated the first exemplary semiconductor structure of FIG. 1 after forming an undoped strontium titanate layer 14 on the upper surface of the dielectric material layer 12. In some embodiments of the present invention, the undoped strontium titanate layer 14 can be formed directly on an upper surface of the semiconductor substrate 10. In such an embodiment, the undoped strontium titanate layer 14 can have an epitaxial relationship, i.e., same crystal structure, as the upper surface of the semiconductor material of the semiconductor substrate 10.

By "undoped strontium titanate layer" it is meant a layer of strontium titanate (STO) that does not include dopant atoms which replace (i.e., substitute) the strontium ions or the titanium ions within the STO layer, and substantially all oxygen sites are occupied by oxygen ions.

The undoped strontium titanate layer 14 can be formed as a blanket layer utilizing any deposition method that can form such an undoped strontium titanate layer 14. Examples of deposition processes that can be used include, but are not limited to, chemical vapor deposition, plasma enhanced chemical vapor deposition, metalorgano chemical vapor deposition (MOCVD), molecular beam epitaxy, sputtering and atomic layer deposition.

In one embodiment of the present invention, the undoped strontium titanate layer 14 can have a thickness in a range from 0.5 nm to 100 nm. Other thicknesses that are lesser than or greater than the aforementioned thickness range can also be employed for the undoped strontium titanate layer 14.

Figure 3:
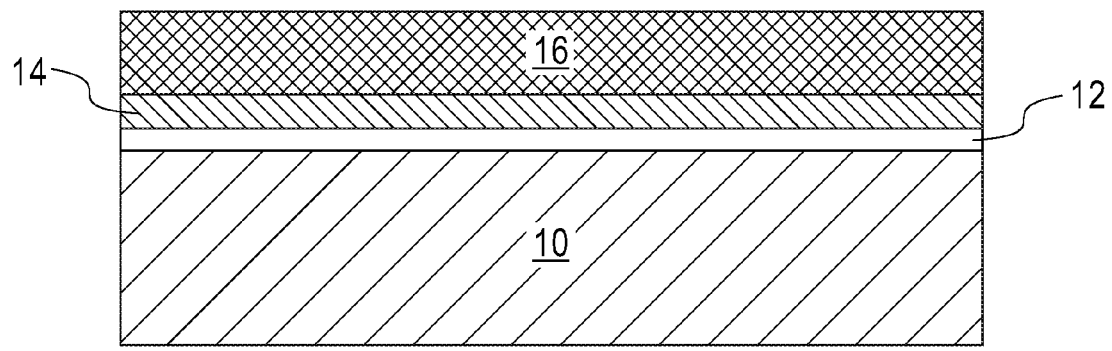
FIG. 3 is a cross sectional view of the first exemplary semiconductor structure of FIG. 2 after epitaxially forming a ferroelectric perovskite material layer on an upper surface of the undoped strontium titanate layer in accordance with an embodiment of the present invention.

Referring now to FIG. 3, there is illustrated the first exemplary semiconductor structure shown in FIG. 2 after epitaxially forming a ferroelectric perovskite material layer 16 on an upper surface of the undoped strontium titanate layer 14 in accordance with an embodiment of the present invention. In accordance with the present invention and since an epitaxial deposition process is used in forming the ferroelectric perovskite material layer 16 directly on an upper surface of the undoped strontium titanate layer 14, the ferroelectric perovskite material layer 16 has an epitaxial relationship, i.e., same crystal structure, as the upper surface of undoped strontium titanate layer 14. It is noted that by providing an epitaxial ferroelectric perovskite material layer 16 in a ferroelectric transistor, a single domain configuration of the ferroelectric perovskite may be obtained under appropriate operating conditions. Otherwise, a multiple domain configuration may be obtained.

The ferroelectric perovskite material layer 16 can include any ferroelectric perovskite material. Illustrative examples of ferroelectric perovskites that can be used as the ferroelectric perovskite material layer 16 include lead zirconate titanate ($PbZr_xTi_{1-x}O_3$ with $0 \leq x \geq 1$), barium strontium titanate ($Ba_{1-x}Sr_xTiO_3$ with $0 \leq x \geq 1$), barium titanate ($BaTiO_3$), bismuth iron oxide ($BiFeO_3$), and strontium bismuth tantalate ($SrBi_2Ta_2O_9$). In some embodiments, the ferroelectric perovskite material layer 16 can be composed of $HfO_2$ that is doped with Si, La, Zr and/or Y).

The ferroelectric perovskite material layer 16 can be formed as a blanket layer utilizing any epitaxial deposition method that can form such a layer. Examples of deposition processes that can be used include, but are not limited to, chemical vapor deposition, plasma enhanced chemical vapor deposition, metalorgano chemical vapor deposition (MOCVD), molecular beam epitaxy, sputtering and atomic layer deposition.

In one embodiment of the present invention, the ferroelectric perovskite material layer 16 can have a thickness in a range from 1 nm to 1000 nm. Other thicknesses that are lesser than or greater than the aforementioned thickness range can also be employed for the ferroelectric perovskite material layer 16.

Figure 4:
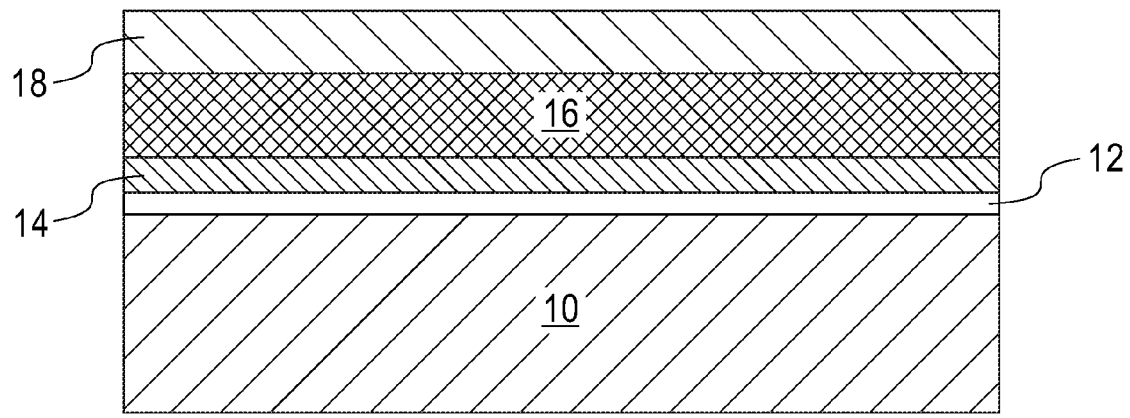
FIG. 4 is a cross sectional view of the first exemplary semiconductor structure of FIG. 3 after forming a doped strontium titanate layer on an upper surface of the ferroelectric perovskite material layer, wherein the doped strontium titanate layer contains a dopant other than Nb, Ta or V in accordance with another embodiment of the present invention.

Referring now to FIG. 4, there is illustrated the first exemplary semiconductor structure of FIG. 3 after forming a doped strontium titanate layer 18 on an upper surface of the ferroelectric perovskite material layer 16. In accordance with the present invention, the doped strontium titanate layer 18 contains a dopant other than Nb, Ta or V. Also, and in some embodiments of the present invention, the doped strontium titanate layer 18 has an epitaxial relationship, i.e., same crystal structure, as the upper surface of the ferroelectric perovskite material layer 16.

It is noted that although the present invention illustrates the formation of a material stack which includes, from bottom to top, the ferroelectric perovskite material layer 16 and the doped strontium titanate layer 18, the present invention also contemplates an embodiment in which a material stack comprising, from bottom to top, the doped strontium titanate layer 18 and the ferroelectric perovskite material layer 16 is formed. In such an embodiment, the position of layers 16 and 18 within the drawings of the present invention would be reversed.

By "doped strontium titanate layer" it is meant a layer of strontium titanate (STO) in which dopant atoms (typically metal ions other than Sr and Ti) replace (i.e., substitute) the strontium ions or the titanium ions within the STO layer, and/or some of the oxygen sites of the STO are vacant.

In some embodiments, and when an n-type doped strontium titanate layer is to be formed, n-type dopants such as, for example, La ions or oxygen vacancies, can be employed. In other embodiments, and when a p-type doped strontium titanate layer is to be formed, p-type dopants such as, for example, In ions, Al ions, Fe ions or Sc ions can be employed. In one embodiment, the amount of dopants that can be present within the doped strontium titanate layer 18 can range from 0.01 atomic percent to 5 atomic percent, where the amount of dopants is defined as the areal density of dopants divided by the areal density of all atoms or ions comprising the doped strontium titanate layer, converted to a percentage. In another embodiment, the amount of dopants that can be present within the doped strontium titanate layer 18 can range from 0.0000001 atomic percent to 0.01 atomic percent. In yet another embodiment, the amount of dopants that can be present within the doped strontium titanate layer 18 can range from 5 atomic percent to 10 atomic percent.

Dopant metal ions can be introduced into a strontium titanate layer during deposition, for example by co-deposition of metal atoms, ions, or precursor molecules, utilizing any of the deposition processes mentioned above in forming the undoped strontium titanate layer 14. Such processes can be used to provide doped strontium titanate layer 18. Doped strontium titanate layer 18 can also be formed be formed by depositing a thin metal layer on top of an undoped $SrTiO_3$ layer and diffusing metal atoms from the thin metal layer into the undoped $SrTiO_3$ layer by annealing.

When a doped strontium titanate layer 18 is provided that includes oxygen vacancies, the oxygen vacancies can be introduced into a strontium titanate layer during deposition, for example by deposition under oxygen-deficient conditions. Alternatively, oxygen vacancies can be introduced into a strontium titanate layer after deposition, for example by annealing the strontium titanate layer in an oxygen-deficient environment, or by annealing the strontium titanate layer in the vicinity of an oxygen gettering layer, for example a silicon substrate which reacts with oxygen ions to form silicon oxide, or a suitable elemental or compound metal layer which reacts with oxygen ions to form a metal oxide.

It is noted that a wide range of carrier densities within the doped strontium titanate layer 18 can be achieved by selecting an appropriate doping level. In one example, the carrier density of the doped strontium titanate layer 18 is from about $10^{20}$ charges per cubic centimeter to about $10^{22}$ charges per cubic centimeter. In another example, the carrier density of the doped strontium titanate layer 18 is from about $10^{15}$ charges per cubic centimeter to about $10^{20}$ charges per cubic centimeter.

In one embodiment of the present invention, the doped strontium titanate layer 18 can have a thickness in a range from 0.5 nm to 100 nm. Other thicknesses that are lesser than or greater than the aforementioned thickness range can also be employed for the doped strontium titanate layer 18.

Figure 5:
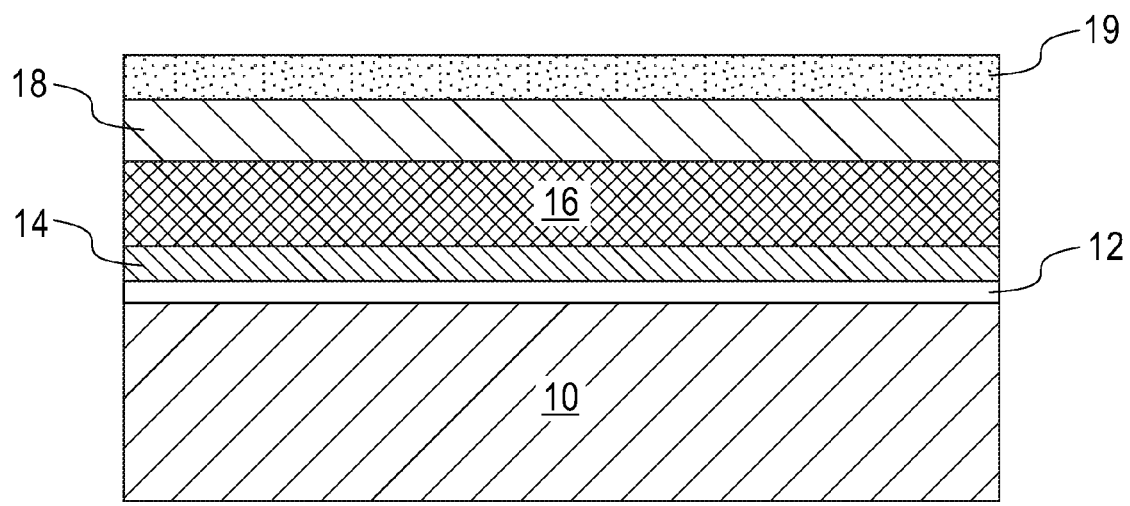
FIG. 5 is a cross sectional view of the first exemplary semiconductor structure of FIG. 4 after forming a gate electrode material layer on a surface of the doped strontium titanate layer.

Referring now to FIG. 5, there is illustrated the first exemplary semiconductor structure of FIG. 4 after forming a gate electrode material layer 19 on a surface of the doped strontium titanate layer 18. The gate electrode material layer 19 is a blanket layer that covers an entirety of the upper surface of the doped strontium titanate layer 18.

The gate electrode material layer 19 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide), a perovskite or a multilayered combination thereof.

The gate electrode material layer 19 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate electrode material layer 19 has a thickness from 1 nm to 100 nm. Other thicknesses that are lesser than or greater than the aforementioned thickness range can also be employed for the gate electrode material layer 19.

Figure 6:
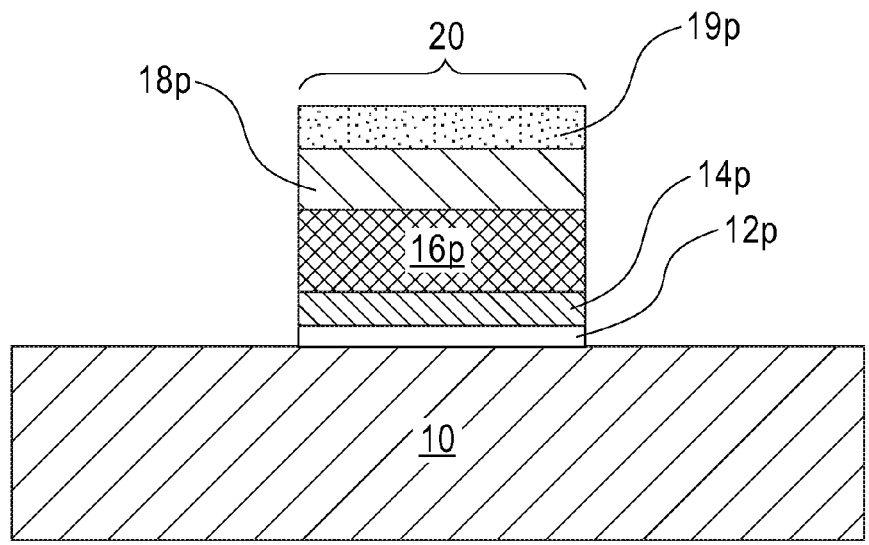
FIG. 6 is a cross sectional view of the first exemplary semiconductor structure of FIG. 5 after patterning at least the undoped strontium titanate layer, the ferroelectric perovskite material layer, the doped strontium titanate layer and the gate electrode material layer into a gate stack comprising, from bottom to top, an undoped strontium titanate portion, a ferroelectric perovskite material portion, a doped strontium titanate portion and a gate electrode material portion.

Referring now to FIG. 6, there is illustrated the first exemplary semiconductor structure of FIG. 5 after patterning at least the undoped strontium titanate layer 14, the ferroelectric perovskite material layer 16, the doped strontium titanate layer 18, and the gate electrode material layer 19 into a gate stack 20 comprising, from bottom to top, an undoped strontium titanate portion 14p, a ferroelectric perovskite material portion 16p, a doped strontium titanate portion 18p and a gate electrode material portion 19p. In some embodiments of the present invention, the gate stack 20 may be referred to herein as a ferroelectric memory gate stack. When dielectric material 12 is present, the dielectric material 12 can also be patterned at this time of the present invention. In some other embodiments, the dielectric material 12 can be patterned later on in the processing of the ferroelectric transistor of the present invention.

In the embodiment illustrated in the drawings, the gate dielectric material 12 is patterned at the same time as the undoped strontium titanate layer 14, the ferroelectric perovskite material layer 16, the doped strontium titanate layer 18 and the gate electrode material layer 19. In the illustrated embodiment, a gate stack 20 comprising, from bottom to top, a dielectric material portion 12p, an undoped strontium titanate portion 14p, a ferroelectric perovskite material portion 16p, a doped strontium titanate portion 18p and a gate electrode material portion 19p is provided. Elements 14p, 16p, and 18p may be referred to herein as a ferroelectric gate stack.

It is again noted that in the embodiment in which layers 16 and 18 are reversed, this step of the present invention would provide a gate stack 20 comprising, from bottom to top, an undoped strontium titanate portion 14p, a doped strontium titanate portion 18p, a ferroelectric perovskite material portion 16p and a gate electrode material portion 19p. In some embodiments of the present invention, the undoped strontium titanate portion 14p may be omitted.

As is shown in FIG. 6, outermost edges of the dielectric material portion 12p, the undoped strontium titanate portion 14p, the ferroelectric perovskite material portion 16p, the doped strontium titanate portion 18p and the gate electrode material portion 19p of the gate stack 20 are vertically aligned with each other. By "vertically aligned" it is meant that the outer edges of portions 12p, 14p, 16p, 18p and 19p do not extend beyond each other. When the dielectric material is omitted, outermost edges of the undoped strontium titanate portion 14p, the ferroelectric perovskite material portion 16p, the doped strontium titanate portion 18p and the gate electrode material portion 19p of the gate stack 20 are vertically aligned with each other.

Patterning of the first exemplary semiconductor structure shown in FIG. 5 (with or without the dielectric material 12) can be achieved by photolithography and etching. Photolithography includes applying a photoresist material (not shown) on the upper surface of the gate electrode material layer 19, exposing the photoresist material to a desired pattern of radiation and then developing the photoresist material utilizing a resist developer. The etching may include any anisotropic etching process including for example, dry etching and/or wet chemical etching. In one example, the anisotropic etching process comprises a reactive ion etching process. A single anisotropic etching process or multiple anisotropic etching processes can be used in forming the gate stack 20 of the present invention.

Figure 7:
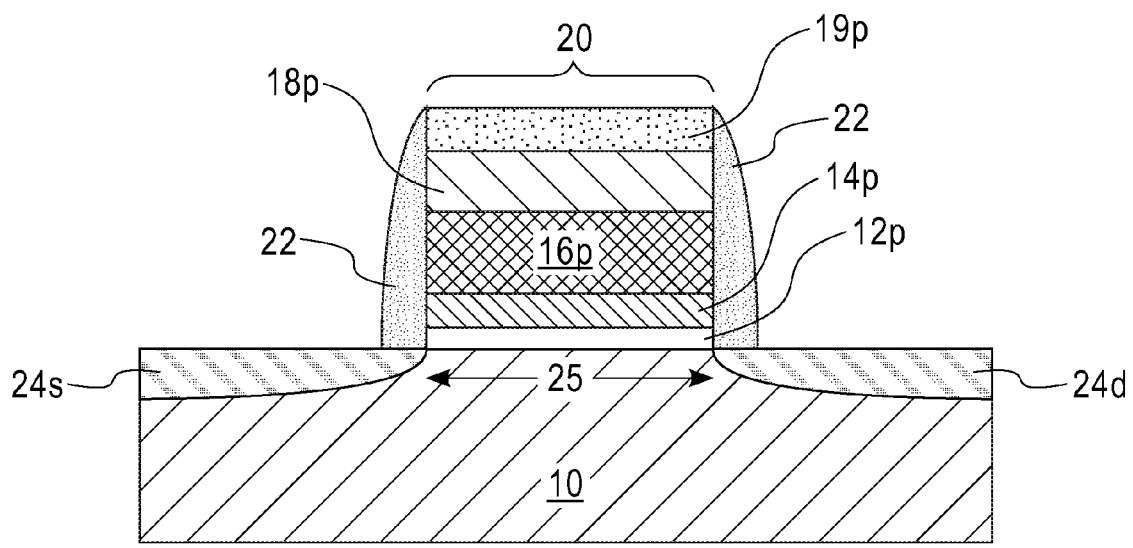
FIG. 7 is a cross sectional view of the first exemplary semiconductor structure of FIG. 6 after forming a spacer on each vertical sidewall of the gate stack and after forming a source region on one side of the gate stack and a drain region on another side of the ferroelectric memory gate stack.

Referring now to FIG. 7, there is illustrated the first exemplary semiconductor structure of FIG. 6 after forming a spacer 22 on each vertical sidewall of the gate stack 20 and after forming a source region 24s on one side of the gate stack 20 and a drain region 24d on another side of the gate stack 20. In some embodiments of the present invention, the formation of spacer 22 can be omitted.

In the embodiment illustrated, each spacer 22 has a base (defined by the bottommost horizontal surface of the spacer) that is present directly on an exposed portion of the semiconductor substrate 10. Each spacer also has a sidewall surface that directly contacts a vertical sidewall of the gate stack 20. In other embodiments (not illustrated), each spacer 22 has a base (defined by the bottommost horizontal surface of the spacer) that is present directly on an exposed portion of the dielectric material layer 12.

The spacer 22 can be formed by first providing a spacer material and then etching the spacer material. The spacer material may be composed of any dielectric spacer material including, for example, a dielectric oxide, dielectric nitride, and/or dielectric oxynitride. In one example, the spacer material used in providing the spacer 22 may be composed of silicon dioxide or silicon nitride. The spacer material can be provided by a deposition process including, for example, chemical vapor deposition (CVD), plasma enhanced chemical vapor deposition (PECVD), and physical vapor deposition (PVD). The etching of the spacer material may comprise a dry etch process such as, for example, a reactive ion etch. In embodiments, in which the dielectric material layer 12 was not previously patterned, the dielectric material layer 12 can be patterned at the same time of spacer 22 formation utilizing the spacer etch or after spacer formation utilizing photolithography and etching.

In some embodiments, and prior to spacer 22 formation, a source extension region and a drain extension region (both of which are not specifically shown) can be formed by ion implantation. After spacer formation 22, a source region 24s is formed within an exposed portion of the semiconductor substrate 10 and on one side of the gate stack 20 and a drain region 24d is formed within another exposed portion of the semiconductor substrate 10 and on another side of the gate stack 20. The source region 24s and the drain region 24d can be formed utilizing a source/drain ion implantation process. Following the ion implantation process, the implanted dopants used in forming the source region 24s and the drain region 24d can be activated utilizing an activation anneal process. The portion of the semiconductor substrate 10 that is located directly beneath the gate stack 20 and flanked on one side by the source region 24s and the other side by the drain region 24d is referred to as a channel region 25.

The semiconductor device, e.g., ferroelectric transistor, of the present invention which is provided above includes a semiconductor substrate 10 having a source region 24s and a drain region 24d located within the semiconductor substrate 10 and separated by a channel region 25. The semiconductor device of the present invention also includes a gate stack 20 located above the channel region 25 and including, from bottom to top, an undoped strontium titanate portion 14p, a ferroelectric perovskite material portion 16p, a doped strontium titanate portion 18p and a gate electrode material portion 19p, wherein the doped strontium titanate portion contains a dopant other than Nb, Ta or V. In some embodiments (not illustrated), the gate stack 20 located above the channel region 25 can include, from bottom to top, an undoped strontium titanate portion 14p, a doped strontium titanate portion 18p, wherein the doped strontium titanate portion contains a dopant other than Nb, Ta or V, a ferroelectric perovskite material portion 16p and a gate electrode material portion 19p. In some embodiments of the present invention, the undoped strontium titanate portion 14p can be omitted. In other embodiments, and as illustrated above, a dielectric material portion 12p can be positioned directly between the undoped strontium titanate portion 14p and the channel region 25 that is formed within the semiconductor substrate 10.

Figure 8:
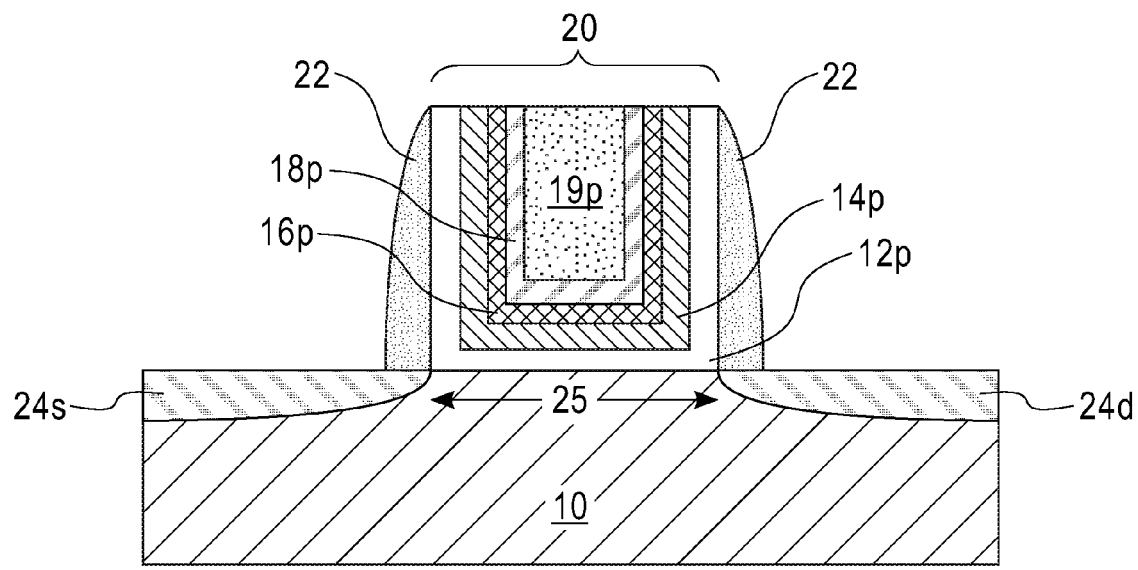
FIG. 8 is a cross sectional view of the first exemplary semiconductor device in accordance with the present invention in which a replacement metal gate process is performed instead of gate first process described in FIGS. 1-7.

Although the above description and FIGS. 1-7 depict a process in which a gate first process is used in forming the structure shown in FIG. 7, a gate last process can also be used to form a structure such as shown, for example, in FIG. 8. In such an embodiment, a sacrificial gate structure (not shown) is formed on a surface of semiconductor substrate. The sacrificial gate structure (not shown) may include a sacrificial gate dielectric material (such as, for example, silicon dioxide) and a sacrificial gate material (such as, for example, polysilicon). The sacrificial gate structure can be formed by deposition of the sacrificial gate dielectric material and/or the sacrificial gate material, followed by patterning the deposited sacrificial materials by lithography and etching. After formation of the sacrificial gate structure, a source region 24s and a drain region 24d can be formed into the semiconductor substrate 10 and at the footprint of the sacrificial gate structure. The source region 24s and drain region 24d can be formed as described above. Next, spacers 22 can be optionally formed at this point of the present invention. In some embodiments, spacer 22 formation can be performed within a gate cavity provided after removing the sacrificial gate structure.

A dielectric material 27 having an upper surface that is planar with an upper surface of the sacrificial gate structure is then formed. The dielectric material 27 may be formed by any deposition process and an optional planarization or etch back process may follow the deposition of the dielectric material 27. Dielectric material 27 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 27. The use of a self-planarizing dielectric material as dielectric material v may avoid the need to perform a subsequent planarizing step.

Next, the sacrificial gate structure is removed by etching so as to provide a gate cavity within the dielectric material 27 that exposes a portion of the semiconductor substrate 10 between the source region 24s and drain region 24d. The gate cavity occupies the area, i.e., volume, of the previous removed sacrificial gate structure. Next, an undoped strontium titanate portion 14p, a ferroelectric perovskite material portion 16p, a doped strontium titanate portion 18p and a gate electrode material portion 19p, wherein the doped strontium titanate portion contains a dopant other than Nb, Ta or V is formed by deposition of the various material described above into the gate cavity. In some embodiments (not illustrated), the gate stack 20 located can include, from bottom to top, an undoped strontium titanate portion 14p, a doped strontium titanate portion 18p, wherein the doped strontium titanate portion contains a dopant other than Nb, Ta or V, a ferroelectric perovskite material portion 16p and a gate electrode material portion 19p. In some embodiments of the present invention, the undoped strontium titanate portion 14p can be omitted. In other embodiments, and as illustrated above, a dielectric material portion 12p can be positioned directly between the undoped strontium titanate portion 14p and the channel region 25 that is formed within the semiconductor substrate 10.

Figure 9:
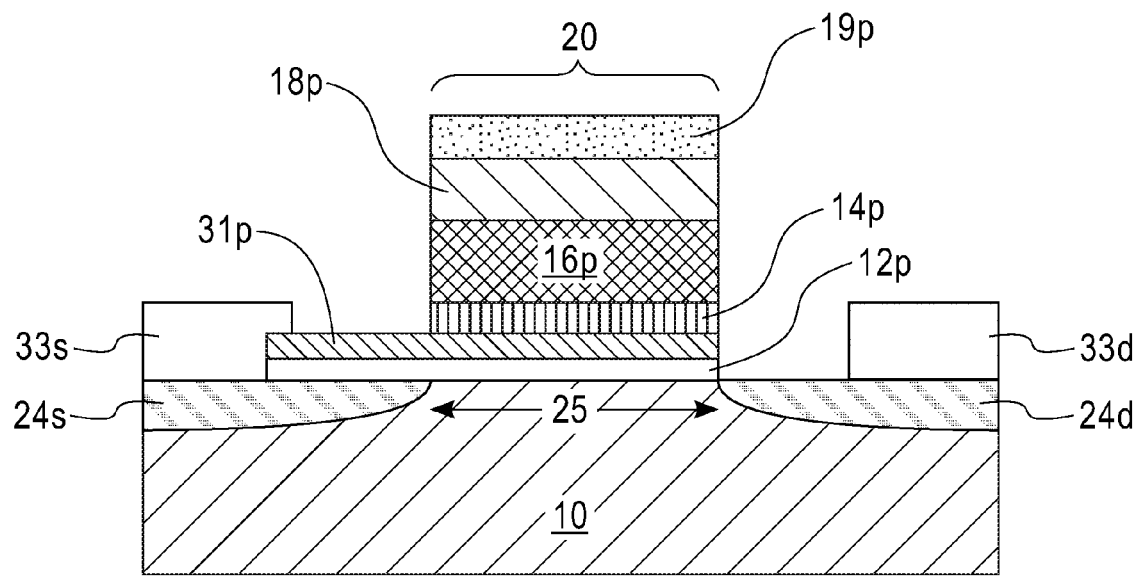
FIG. 9 is a cross sectional view of an alternative semiconductor device that can be formed in the present invention which includes a ferroelectric gate structure in accordance with the present invention located atop a conductive layer that is disposed on a semiconductor substrate.

Referring now to FIG. 9, there is illustrated an alternative semiconductor device that can be formed in the present invention which includes a ferroelectric gate structure (including elements 14p, 16p and 18p as defined above) in accordance with the present invention located atop a conductive material layer 31p that is disposed on a semiconductor substrate. The ferroelectric gate structure includes a conductive electrode material portion 19p located on a topmost surface of the ferroelectric gate structure. In some embodiments, gate dielectric material portion 12p is located between the conductive material layer 31p and the semiconductor substrate 10. In other embodiments, the gate dielectric material portion 12p is omitted. The structure further includes a source contact 33s and a drain contact 33d. The source contact 33s has a first surface portion located directly on an uppermost surface of semiconductor substrate 10 (e.g., source region 24s) and a second surface portion that is located directly on and in physical contact with the uppermost surface of the conductive material layer 31p that extends beyond the vertical edges of the ferroelectric gate structure (i.e., elements 14p, 16p and 18p). The drain contact is located entirely on an uppermost surface of the semiconductor substrate 10 (e.g., drain region 24d). The structure shown in FIG. 9 can be formed utilizing the basic processing steps as mentioned above in FIGS. 1-7 except that a conductive material layer is formed prior to forming any of elements 14, 16, 18 and 19. The conductive material layer 31p may include, but is not limited to, doped strontium titanate, tantalum nitride, tantalum silicon nitride, a transparent conducting oxide, or a carbon nanostructure. The conductive material layer 31p may have a thickness of about 3 nanometers or less. The conductive material layer 31p may further have a carrier density of about $1 \times 10^{21}$ charges per cubic centimeter. The conductive material layer 31p may further have an internal dielectric constant of about 30 or greater. After forming a material stack including optionally, dielectric material 12, conductive material layer 31p, and elements 14, 16, 18 and 19, elements 14, 16, 18 and 19 are patterned by lithography and etching forming gate stack 20 that includes elements 14p, 16p, 18p, and 19p. After forming the gate structure, the conductive material layer 31p and, if present, the dielectric material layer 12 can be patterned by lithography and etching. Source contact 33s and drain contact 33d which may include a conductive metal such as, for example, nickel silicide, cobalt silicide, titanium silicide, or titanium nitride, can for example be formed by a self-aligned silicidation process, by lithography and etching, or by a lift-off process.

Referring now to FIGS. 10-15 which illustrate processing steps that can be used in forming another semiconductor device, e.g., floating gate transistor. The term "floating gate transistor" is used herein to denote a field effect transistor, whose structure is similar to a conventional metal oxide semiconductor field effect transistor (MOSFET). The gate of the floating gate transistor is electrically isolated, creating a floating node in DC, and a number of secondary gates or inputs are deposited above the floating gate (FG) and are electrically isolated from it. These inputs are only capacitively connected to the FG. Since the FG is completely surrounded by highly resistive material, the charge contained in it remains unchanged for long periods of time. Usually Fowler-Nordheim tunneling and hot-carrier injection mechanisms are used to modify the amount of charge stored in the FG.

Figure 10:
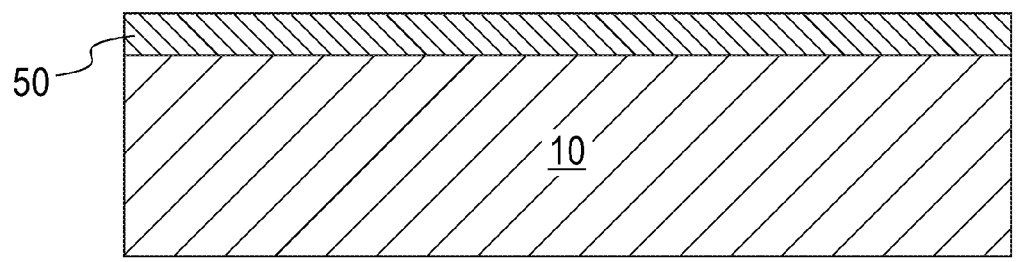
FIG. 10 is a cross sectional view of a second exemplary semiconductor structure after forming a first insulator material layer on an upper surface of a semiconductor substrate in accordance with an embodiment of the present invention.

Referring first to FIG. 10, there is illustrated a second exemplary semiconductor structure after forming a first insulator material layer 50 on an upper surface of a semiconductor substrate 10 in accordance with an embodiment of the present invention. The second exemplary semiconductor structure can be used in forming a floating gate transistor of the present invention. The semiconductor substrate 10 may include one of the semiconductor substrates mentioned above in the describing the ferroelectric transistor of the present invention.

The first insulator layer 50 is a blanket dielectric material layer that is provided on an upper surface of the semiconductor substrate. The first insulator layer 50 can be a dielectric oxide, a dielectric nitride, and/or a dielectric oxynitride. In one example, the insulator layer 50 can be a semiconductor oxide (i.e., $SiO_2$), a semiconductor nitride (i.e., SiN), semiconductor oxynitride (i.e., SiON) or any multilayered combination thereof. The first insulator layer 50 can also include one of the dielectric metal oxides mentioned above for dielectric material layer 12. In some embodiments, the first insulator layer 50 can include a multilayered stack of a semiconductor oxide (i.e., $SiO_2$), a semiconductor nitride (i.e., SiN) or semiconductor oxynitride (i.e., SiON) and at least one of dielectric metal oxide. In some embodiments, the first insulator layer may include a non-doped $SrTiO_3$ layer.

In some embodiments, the first insulator layer 50 can be formed by any deposition technique including, for example, chemical vapor deposition (CVD), plasma enhanced chemical vapor deposition (PECVD), physical vapor deposition (PVD), sputtering, molecular beam epitaxy and atomic layer deposition. In other embodiments, the first insulator layer 50 can be formed by a thermal growth process such as, for example, thermal oxidation. In yet another embodiment, a combination of thermal growth process and deposition can be used in forming the first insulator layer 50.

In one embodiment of the present invention, the first insulator layer 50 can have a thickness in a range from 0.1 nm to 10 nm. Other thicknesses that are lesser than or greater than the aforementioned thickness range can also be employed for the first insulator layer 50.

Figure 11:
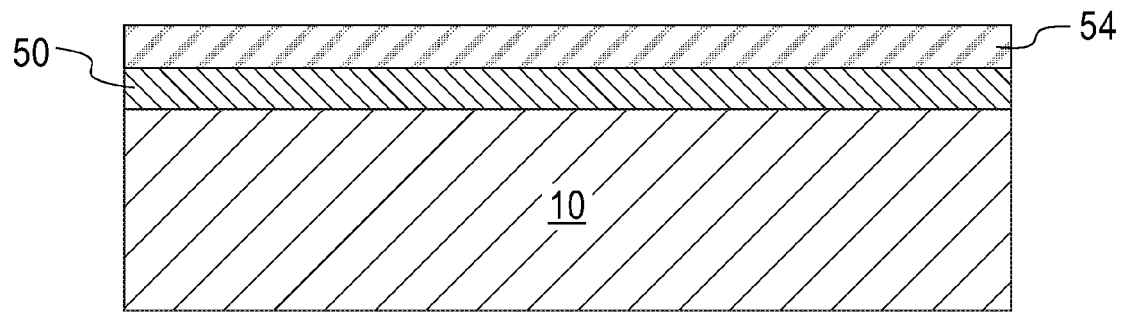
FIG. 11 is a cross sectional view of the second exemplary semiconductor structure of FIG. 10 after forming a doped strontium titanate layer directly above the first insulator layer.

Referring now to FIG. 11, there is illustrated the second exemplary semiconductor structure of FIG. 10 after forming a doped strontium titanate layer 54. The doped strontium titanate layer 54 is formed as a blanket layer atop the first insulator material layer 50.

The doped strontium titanate layer 54 that can be used in this embodiment of the present invention is similar to the doped strontium titanate layer 18 used in the ferroelectric transistor embodiment with the exception that Nb, V and Ta can also be used as metallic dopants. Thus, in the present embodiment for forming the floating gate transistor the metallic dopants can include La ions, Nb ions, V ions, and Ta ions, as n-type dopants; and In ions, Al ions, Fe ions and Sc ions, as p-type dopants.

In one embodiment, the amount of dopants that can be present within the doped strontium titanate layer 54 can range from 0.01 atomic percent to 20 atomic percent. In another embodiment, the amount of dopants that can be present within the doped strontium titanate layer 54 can range from 0.0000001 atomic percent to 0.01 atomic percent. In yet another embodiment, the amount of dopants that can be present within the doped strontium titanate layer 54 can range from 20 atomic percent to 50 atomic percent.

Dopant metal ions can be introduced into a strontium titanate layer during deposition, for example, by co-deposition of metal atoms, ions, or precursor molecules, utilizing any of the deposition processes mentioned above in forming the undoped strontium titanate layer 14. Such processes can be used to provide doped strontium titanate layer 54. A doped strontium titanate layer can also be formed be formed by depositing a thin metal layer on top of an undoped $SrTiO_3$ layer and diffusing metal atoms from the thin metal layer into the undoped $SrTiO_3$ layer by annealing.

The doped strontium titanate layer 54 can also contain oxygen vacancies. The oxygen vacancies can be introduced into a strontium titanate layer during deposition, for example by deposition under oxygen-deficient conditions. Alternatively, oxygen vacancies can be introduced into a strontium titanate layer after deposition, for example by annealing the strontium titanate layer in an oxygen-deficient environment, or by annealing the strontium titanate layer in the vicinity of an oxygen gettering layer, for example a silicon substrate which reacts with oxygen ions to form silicon oxide, or an elemental or compound metal layer suitable metal layer which reacts with oxygen ions to form a metal oxide.

It is noted that a wide range of carrier densities within the doped strontium titanate layer 54 can be achieved by selecting an appropriate doping level. In one example, the carrier density of the doped strontium titanate layer 54 is from about $10^{20}$ charges per cubic centimeter to about $10^{22}$ charges per cubic centimeter. In another example, the carrier density of the doped strontium titanate layer 54 is from about $10^{15}$ charges per cubic centimeter to about $10^{20}$ charges per cubic centimeter.

In one embodiment of the present invention, the doped strontium titanate layer 54 can have a thickness in a range from 0.5 nm to 100 nm. Other thicknesses that are lesser than or greater than the aforementioned thickness range can also be employed for the doped strontium titanate layer 54.

Figure 12:
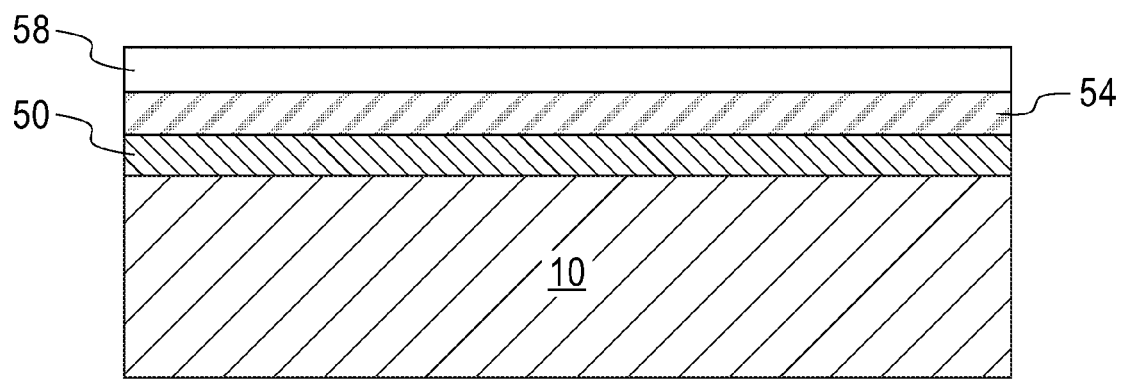
FIG. 12 is a cross sectional view of the second exemplary semiconductor structure of FIG. 11 after forming a second insulator material layer directly above the doped strontium titanate layer.

Referring now to FIG. 12, there is illustrated the second exemplary semiconductor structure of FIG. 11 after forming a second insulator material layer 58 directly on an upper surface of the doped strontium titanate layer 54.

The second insulator material layer 58 may comprise one of the dielectric materials mentioned above for the first insulator material layer 50. In one embodiment, the second insulator material layer 58 comprises a same dielectric material as the first insulator material layer 50. In another embodiment, the second insulator material layer 58 comprises a different dielectric material as the first insulator material layer 50. The second insulator material layer 58 may be formed utilizing one the techniques mentioned above in forming the first insulator material layer 50. The second insulator material layer 58 may have a thickness within the range mentioned above for the first insulator material layer 50.

In some embodiments of the present invention, the second insulator material layer 58 may include one of the perovskite materials mentioned above for ferroelectric perovskite material layer 16. Non-ferroelectric perovskite materials can also be used as the material providing a perovskite material layer that can be used as the second insulator material layer 58. In one example, the second insulator material layer 58 may comprise $BaTiO_3$. The perovskite material layer can be formed utilizing one of the methods mentioned above in forming the ferroelectric perovskite material layer 16. In one embodiment of the present invention, the perovskite material layer can have a thickness in a range from 1 nm to 100 nm. Other thicknesses that are lesser than or greater than the aforementioned thickness range can also be employed for the perovskite material layer.

In some embodiments of the present invention, the second insulator material layer 58 may include a multilayered stack of a perovskite material and one of the dielectric materials used as the first insulator material layer 50. In some embodiments, the second insulator material layer 58 may have an epitaxial relationship with the doped strontium titanate layer 54.

Figure 13:
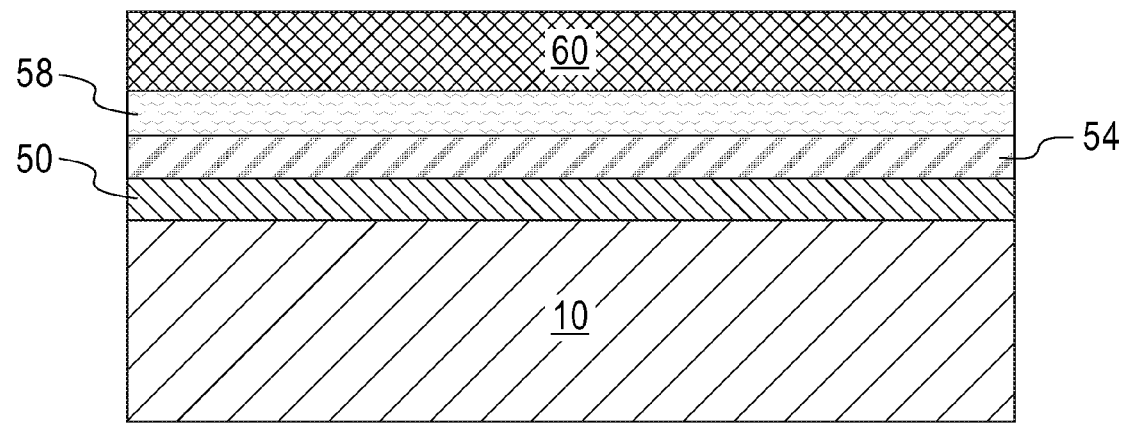
FIG. 13 is a cross sectional view of the second exemplary semiconductor structure of FIG. 12 after forming a control gate layer on an upper surface of the second insulator material layer.

Referring to FIG. 13, there is illustrated the second exemplary semiconductor structure of FIG. 12 after forming a control gate layer 60 on an upper surface of the second insulator material layer 58. The control gate layer 60 is a blanket layer that covers an entirety of the upper surface of the second insulator material layer 58.

The control gate layer 60 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide), a perovskite or a multilayered combination thereof. The control gate layer can also include a structure including, in any order, doped strontium titanate and a perovskite, wherein the doped strontium titanate and the perovskite have an epitaxial relationship. In such an embodiment, the doped strontium titanate and/or the perovskite can be the same or different than the doped strontium titanate layer and the perovskite described above for layers 54 and 58.

The control gate layer 60 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In embodiments in which a perovskite or a structure including doped strontium titanate and a perovskite are employed, any of the techniques mentioned above in forming layers 54 and 58 can also be used in forming the control gate layer 60. When a metal silicide is formed, a conventional silicidation process is employed. In one embodiment, the control gate layer 60 has a thickness from 1 nm to 100 nm. Other thicknesses that are lesser than or greater than the aforementioned thickness range can also be employed for the control gate layer 60.

Figure 14:
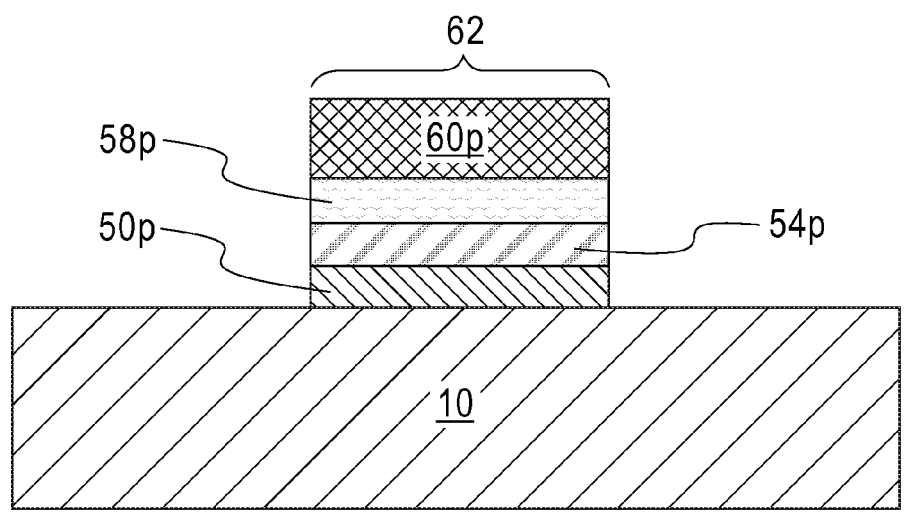
FIG. 14 is a cross sectional view of the second exemplary semiconductor structure of FIG. 13 after patterning the first insulator material layer, the doped strontium titanate layer, the second insulator material layer, and the control gate layer into a gate stack comprising, from bottom to top, a first insulator material portion, a doped strontium titanate portion, a second insulator material portion and a control gate.

Referring now to FIG. 14, there is illustrated the second exemplary semiconductor structure of FIG. 13 after patterning the first insulator material layer 50, the doped strontium titanate layer 54, the second insulator material layer 58, and the control gate layer 60 into a gate stack 62 that comprises, from bottom to top, a first insulator material portion 50*p*, a doped strontium titanate portion 54*p*, a second insulator material portion 58*p* and a control gate 60*p*. As is shown in FIG. 11, outer edges of the various elements (i.e., first insulator material portion 50*p*, doped strontium titanate portion 54*p*, second insulator material portion 58*p* and control gate 60*p*) that form gate stack 62 are vertically aligned.

The patterning of the second exemplary semiconductor structure of FIG. 13 can be performed utilizing photolithograpy and etching as described above in forming the ferroelectric memory gate stack.

Figure 15:
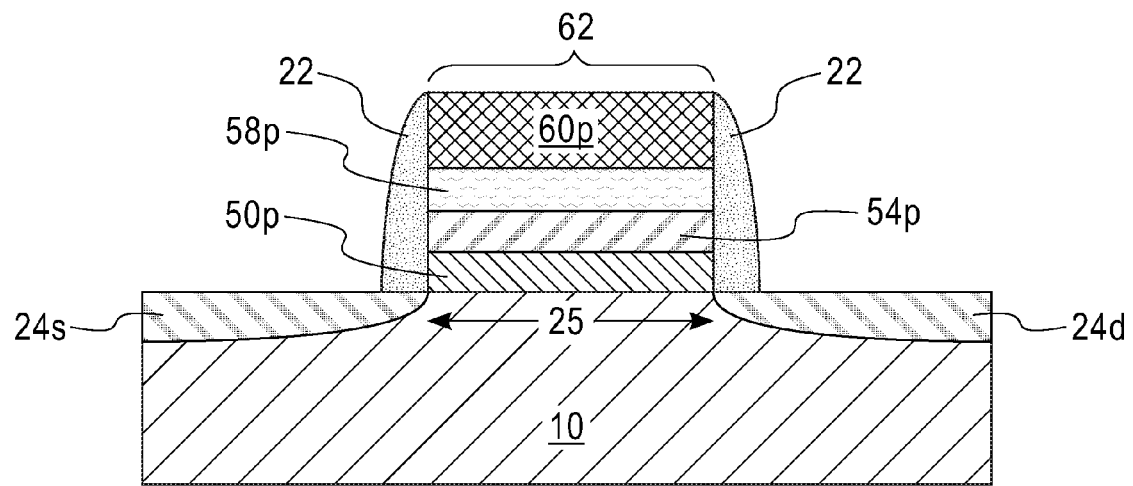
FIG. 15 is a cross sectional view of the second exemplary semiconductor structure of FIG. 14 after forming a spacer on each vertical sidewall of the gate stack and forming a source region on one side of the gate stack and a drain region on another side of the gate stack.

Referring now to FIG. 15, there is illustrated the second exemplary semiconductor structure of FIG. 14 after forming a spacer 22 on each vertical sidewall of the gate stack 62 and forming a source region 24*s* on one side of the gate stack 62 and a drain region 24*d* on another side of the gate stack 62. A channel region 25 is located directly beneath the gate stack 62 and is flanked on one side of the gate stack 62 by the source region 24*s*, and on the other side by the drain region 24.

The spacer 22 can include one of the spacer materials mentioned above in the ferroelectric transistor embodiment, and the spacer 22 can be formed as described above. In some embodiments, spacer 22 can be omitted. The source region 24*s* and the drain region 24*d* can be formed as also described above in forming the source region and the drain region in the ferroelectric memory device embodiment of the present invention.

Specifically, FIG. 15 illustrates a floating gate transistor of the present invention. The floating gate transistor includes a semiconductor substrate 10 having a source region 24*s* and a drain region 24*d* located within the semiconductor substrate 10 and separated by a channel region 25. The floating gate transistor of the present invention further includes a first insulator material portion 50*p* located directly above the channel region 15, a doped strontium titanate layer 54 located on an upper surface of the first insulator material portion 50*p*, a second insulator material portion 58*p* located on an upper surface of the doped strontium titanate layer 54, and a control gate 60*p* located on an upper surface of the second insulator material portion 58p. The floating gate transistor of the present invention can achieve a steep sub-threshold slope.

Figure 16:
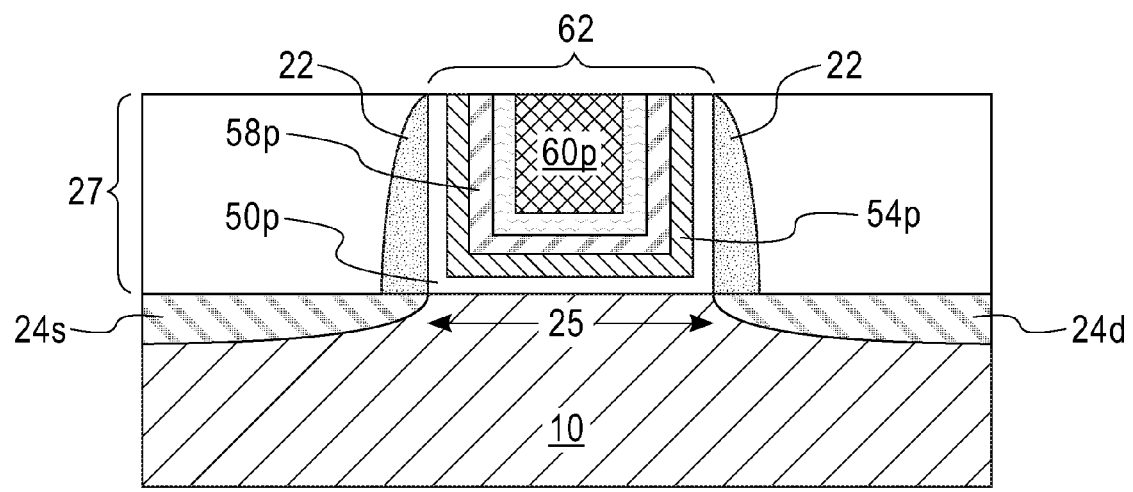
FIG. 16 is a cross sectional view of the first exemplary semiconductor device in accordance with the present invention in which a replacement metal gate process is performed instead of gate first process described in FIGS. 10-15.

Although the above description and FIGS. 10-15 depict a process in which a gate first process is used in forming the structure shown in FIG. 15, a gate last process can also be used to form a structure such as shown, for example, in FIG. 16. The gate last process includes the description provided above in forming the structure shown in FIG. 8 except that the gate stack 62 is formed within the gate cavity instead of the gate stack 20.

While the present invention has been particularly shown and described with respect to various embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor device comprising:
a semiconductor substrate having a source region and a drain region located within said semiconductor substrate and separated by a channel region;
a ferroelectric gate stack located above said channel region and comprising, from bottom to top, an undoped strontium titanate portion, a ferroelectric perovskite material portion located directly on said undoped strontium titanate portion, and a doped strontium titanate portion located directly on said ferroelectric perovskite, wherein said doped strontium titanate portion contains a dopant other than Nb, Ta or V; and
a gate electrode located directly on a surface of said doped strontium titanate portion of said ferroelectric gate stack.

2. The semiconductor device of claim 1, wherein said semiconductor device is a ferroelectric transistor.

3. The semiconductor device of claim 1, wherein said dopant in said doped strontium titanate portion is selected from the group consisting of La ions, In ions, Al ions, Fe ions and Sc ions.

4. The semiconductor device of claim 1, wherein said dopant in said doped strontium titanate portion comprises oxygen vacancies.

5. The semiconductor device of claim 1, wherein said ferroelectric perovskite material portion comprises a material selected from the group consisting of lead zirconate titanate (PZT), barium strontium titanate ($BaSrTiO_3$), barium titanate ($BaTiO_3$), bismuth iron oxide ($BiFeO_3$), and $SrBi_2Ta_2O_9$.

6. The semiconductor device of claim 5, wherein said ferroelectric perovskite material portion comprises $BaTiO_3$.

7. The semiconductor device of claim 1, further comprising a dielectric material portion located directly between said undoped strontium titanate portion and said channel region located within said semiconductor substrate.

8. The semiconductor device of claim 1, wherein sidewall surfaces of said undoped strontium titanate portion, said ferroelectric perovskite material portion, and said doped strontium titanate portion are vertically aligned to each other.

9. The semiconductor device of claim 1, wherein topmost surfaces of said undoped strontium titanate portion, said ferroelectric perovskite material portion, and said doped strontium titanate portion, and said gate electrode portion are coplanar with each other.

10. A semiconductor device comprising:
a semiconductor substrate having a source region and a drain region located within said semiconductor substrate and separated by a channel region;
a ferroelectric gate stack located above said channel region and comprising, from bottom to top, an undoped strontium titanate portion, a ferroelectric perovskite material portion located directly on said undoped strontium titanate portion, and a doped strontium titanate portion located directly on said ferroelectric perovskite, wherein said doped strontium titanate portion contains a dopant other than Nb, Ta or V; and
a gate electrode located on a topmost surface of said doped strontium titanate portion of said ferroelectric gate stack.

11. The semiconductor device of claim 10, wherein said dopant in said doped strontium titanate portion is selected from the group consisting of La ions, In ions, Al ions, Fe ions and Sc ions.

12. The semiconductor device of claim 10, wherein said dopant in said doped strontium titanate portion comprises oxygen vacancies.

13. The semiconductor device of claim 10, wherein said ferroelectric perovskite material portion comprises a material selected from the group consisting of lead zirconate titanate (PZT), barium strontium titanate ($BaSrTiO_3$), barium titanate ($BaTiO_3$), bismuth iron oxide ($BiFeO_3$), and $SrBi_2Ta_2O_9$.

14. The semiconductor device of claim 13, wherein said ferroelectric perovskite material portion comprises $BaTiO_3$.

15. The semiconductor device of claim 10, further comprising a dielectric material portion located directly between said undoped strontium titanate portion and said channel region located within said semiconductor substrate.

* * * * *